United States Patent
Freund et al.

[11] Patent Number: 6,045,321
[45] Date of Patent: Apr. 4, 2000

[54] METHOD AND APPARATUS FOR TRANSPORTING LASER BARS

[75] Inventors: Joseph Michael Freund, Fogelsville; George John Przybylek, Douglasville; Dennis Mark Romero, Allentown, all of Pa.

[73] Assignee: Lucent Technologies, Inc., Murray Hill, N.J.

[21] Appl. No.: 09/046,409

[22] Filed: Mar. 23, 1998

[51] Int. Cl.[7] .................................................. B25J 11/00
[52] U.S. Cl. ........................ 414/783; 414/752.1; 414/816
[58] Field of Search ................................... 414/783, 755, 414/752.1, 816; 294/64.1; 198/380; 279/3

[56] References Cited

U.S. PATENT DOCUMENTS

| | | | |
|---|---|---|---|
| 3,176,825 | 4/1965 | Rudextant | 198/380 |
| 4,473,247 | 9/1984 | Itemadani et al. | 414/752.1 |
| 5,325,384 | 6/1994 | Herb et al. | 372/36 |
| 5,394,426 | 2/1995 | Joslin | 372/50 |
| 5,653,575 | 8/1997 | Park et al. | 414/752.1 |
| 5,719,077 | 2/1998 | Chakrabart et al. | 438/129 |
| 5,780,320 | 7/1998 | Kinoshita | 438/33 |
| 5,876,179 | 3/1999 | Freund et al. | 414/783 |
| 5,888,841 | 3/1999 | Snyder | 438/33 |
| 5,899,730 | 5/1999 | Freund et al. | 438/464 |
| 5,915,915 | 6/1999 | Allen et al. | 414/752.1 |
| 5,938,211 | 8/1999 | Freund et al. | 279/3 |
| 5,956,607 | 9/1999 | Evers | 438/617 |
| 5,989,932 | 11/1999 | Freund et al. | 438/29 |

*Primary Examiner*—Douglas Hess

[57] ABSTRACT

A method of transporting a laser bar, such as from a facet coat holding fixture, and an apparatus for implementing the same. A vacuum collet is automatically positioned at a predetermined position vertically and horizontally offset with respect to a facet of the laser bar. A vacuum is then applied to the vacuum collet to pull the laser bar against it and hold the laser bar in place. Since the vacuum collet is offset horizontally as well as vertically from the bar, the laser bar flips by 90° when the vacuum is applied such that the laser bar longitudinal surface winds up abutting a bottom surface of the vacuum collet, and contact with the laser bar facets is substantially avoided. The vacuum collet is then transported while the vacuum is maintained to thereby transport the laser bar.

18 Claims, 7 Drawing Sheets

METHOD AND APPARATUS FOR TRANSPORTING LASER BARS

BACKGROUND OF THE INVENTION

The present invention relates generally to laser device fabrication, and more particularly, to a method and apparatus for transporting laser bars, e.g., from a facet coat holding fixture.

Semiconductor laser devices such as double heterostructure laser diodes are utilized in a variety of applications such as for optical sources in fiber optic communications. In the manufacture of such devices, double heterostructures are grown and processed on a wafer substrate by, for example, liquid phase epitaxy. The wafer is then cleaved into typically solid rectangular laser bars containing many laser diodes. Since, at the laser bar level, the laser diodes are functional, testing is often performed at this level prior to dicing the individual laser diodes from the bars.

Each laser bar has two end faces (facets) formed by cleaving during the cleaving process. Ultimately, laser light is transmitted through these facets, so it is important for their surfaces to remain unperturbed during subsequent handling. As such, the laser bar should be handled via contact with its longitudinal outer surface rather than the facet surfaces. Following the cleaving operation on the wafer to form the laser bars, the facets are coated with an optical coating while being held in a facet coat holding fixture. Due to the small size of the laser bars (e.g., typical dimensions on the order of 0.005×0.012×0.30 inches), the removal of the laser bars from the holding fixture is a delicate process. A manual removal method may be employed in which an operator manually positions a vacuum pick in proximity to the bar. The bar is temporarily held against the surface of the vacuum pick by suction, thus allowing the operator to transport the bar to a desired location. The vacuum is then turned off and the bar placed down on a surface. While often satisfactory, a drawback to the manual method is the uncertainty in yield due to the skill level of the operator.

Automatic methods of laser bar removal from facet coat holding fixtures have also been developed. Typically, these methods employ a sophisticated robot arm to handle the laser bars, rendering the process costly and complex.

Accordingly, there is a need for a relatively simple automatic laser bar removal and transporting process that is conducive to high yields. The present invention addresses this need.

SUMMARY OF THE INVENTION

The present invention is directed towards a method of transporting a laser bar and an apparatus for implementing the same. In an illustrative embodiment, a vacuum collet is automatically positioned at a location which is vertically and horizontally offset with respect to a facet of the laser bar. A vacuum is then applied to the vacuum collet to pull the laser bar against a surface of the vacuum collet and hold it in place. The vacuum collet contacts the longitudinal surface of the laser bar and substantially avoids contact with the laser bar facets. With the vacuum maintained and the laser bar held in place, the vacuum collet and laser bar are transported.

In one preferred embodiment, the laser bar is removed and transported from a slot of a facet coat holding fixture. Prior to removal from the slot, the laser bar is oriented with one facet facing upward. When the vacuum is applied, the laser bar flips 90° such that the longitudinal side surface winds up abutting the bottom surface of the vacuum collet. Following the laser bar removal from the fixture, the vacuum collet is lowered against a laser bar receiving surface until the laser bar contacts that surface. The vacuum is then released to place the laser bar onto the receiving surface. Accordingly, in essentially a one step automatic process, the laser bar is both removed from the holding fixture and placed onto another surface for subsequent processing or testing.

Advantageously, since the vacuum collet avoids contact with the laser bar facet surfaces, damage to the facets is prevented and a high yield is obtained. Further, the removal and placement operations are performed without the necessity of complex robotics equipment or the like.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF CERTAIN PREFERRED EMBODIMENTS

A preferred embodiment of the invention will now be described for the particular application of removing and transporting a laser bar from a facet coat holding fixture. It is understood, however, that the present invention is not limited to this application, and may be used for general purpose handling and transportation of laser bars.

Figure 1:
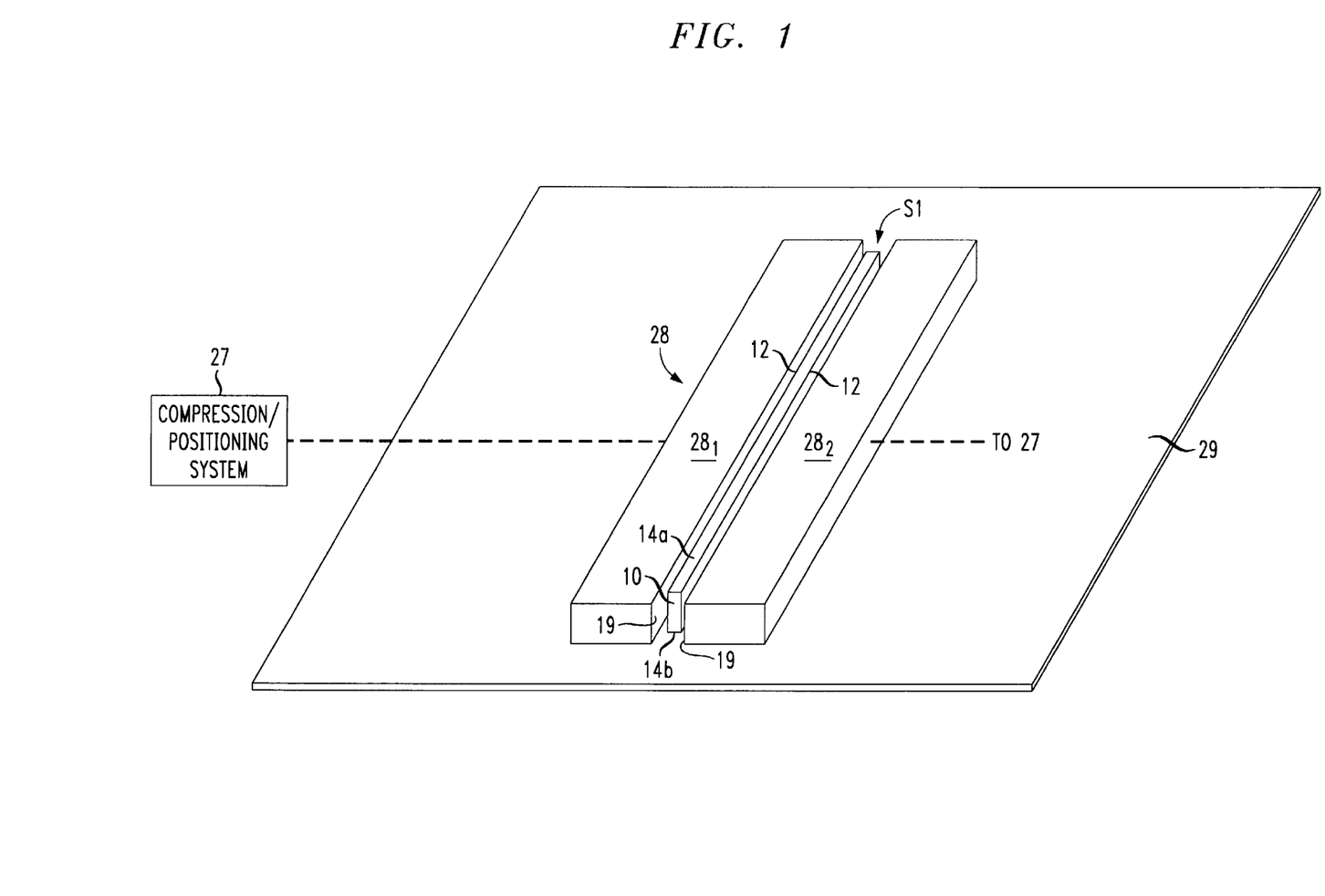
FIG. 1 illustrates a laser bar within a slot of a facet coat holding fixture.

With reference now to FIG. 1, there is shown a laser bar 10 disposed between fixture blades $28_1$ and $28_2$ of a facet coat holding fixture 28. Laser bar 10 is a thin, solid rectangular bar with typical dimensions on the order of 0.005× 0.012×0.300 inches. Laser bar 10 includes facets 14a and 14b on opposite sides, and longitudinal side surfaces 12 perpendicular to the facet surfaces. During handling of the laser bar, contact should be made only with the side surfaces 12 and not with the facets, so as to avoid damaging the critical facet surfaces from which laser light is emitted.

Fixture blades $28_1$, $28_2$ of holding fixture 28 are spring loaded blades which are compressed and decompressed under the control of compression/positioning system 27. The fixture blades are shown in FIG. 1 in the decompressed state, wherein inner surfaces 19 of each blade $28_1$, $28_2$ are separated from the respective longitudinal outer surfaces 12 of laser bar 10. Conversely, in the compressed state, inner surfaces 19 are brought into contact with laser bar surfaces 12, thereby sandwiching the laser bar. As laser bar 10 is sandwiched between the fixture blades, the holding fixture 28 is transported by positioning system 27 to a facet coating apparatus (facet coater), not shown in the figure. With the fixture blades remaining compressed, the facet coater is operated to coat respective upper and lower facets 14a and 14b of the laser bar with an optical coating. Typically, one facet surface 14a or 14b is coated at a time. Following the coating of one facet, compression\positioning system 27 flips the entire holding fixture 28 by 180° while laser bar 10 remains sandwiched between the blades, so as to expose the other facet for coating. Upon completion of the coating operation, the holding fixture 28 is transported to resting surface 29 and fixture blades $28_1$, $28_2$ are decompressed to release laser bar 10. The decompression of the fixture blades forms a slot S1 in which the laser bar is disposed, with one facet resting on surface 29, e.g., a paperlined surface, and the other facet facing upward.

Figure 2:
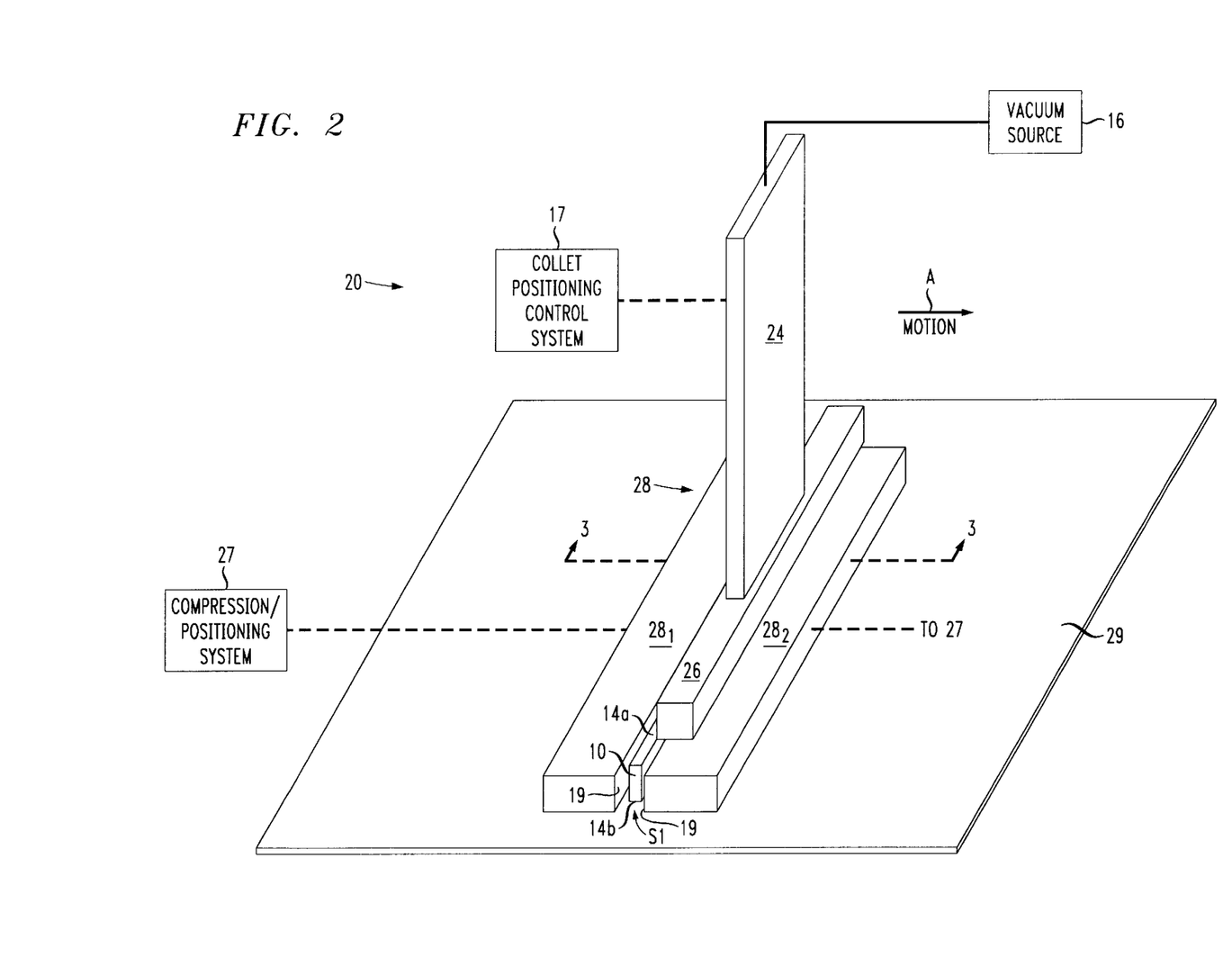
FIG. 2 illustrates an embodiment of a laser bar transporting apparatus in accordance with the invention.

FIG. 2 illustrates an exemplary embodiment of a laser bar transporting apparatus in accordance with the invention, designated as 20. FIGS. 3–6 to be described hereafter are cross-sectional views of a portion of apparatus 20, and collectively illustrate an exemplary laser bar removal and transporting method in accordance with the invention. Transporting apparatus 20 functions to remove a laser bar 10 from holding fixture 28 once the facets of laser bar 10 have been coated.

As shown in FIG. 2, transporting apparatus 20 includes vacuum collet 22, vacuum source 16 and collet positioning control system 17 for controlling the position of vacuum collet 22. Vacuum collet 22 is comprised of an elongated portion 24 and a receiving end portion 26 of a larger cross-section. Receiving end 26 is approximately the same length as holding fixture 28 (which is typically about the same length as the laser bar). Both collet portions 24 and 26 are of rectangular or circular cross-section and have slots running therethrough to allow a vacuum to be applied through the collet. A vacuum source 16 is coupled to vacuum collet 22.

Once the facet coating operation is complete and fixture blades $28_1$ and $28_2$ are separated, receiving end 26 is brought to a predetermined "pre-vacuum" position in proximity to laser bar 10 (e.g., the position shown in FIG. 2). In the pre-vacuum position, receiving end 26 is offset both horizontally and vertically from the top facet surface of laser bar 10 (and also from slot S1). To commence removal of the laser bar, the vacuum is turned on and the suction force of the vacuum through collet 22 pulls laser bar 10 from slot S1 into contact with the bottom surface of receiving end 26. Due to the vertical and horizontal offset of receiving end 26 with respect to the laser bar and slot, the laser bar flips by 90° so that only the longitudinal surface 12 of laser bar 10 makes contact with receiving end 26, while facets 14a and 14b generally avoid such contact. With the vacuum remaining on and laser bar 10 thereby held in place against receiving end 26, positioning system 17 sets vacuum collet 22 in translational motion, e.g., in direction A, to transport laser bar 10 away from holding fixture 28. The laser bar is then placed down on surface 29 or other surface for subsequent processing and/or testing operations.

Figure 3:
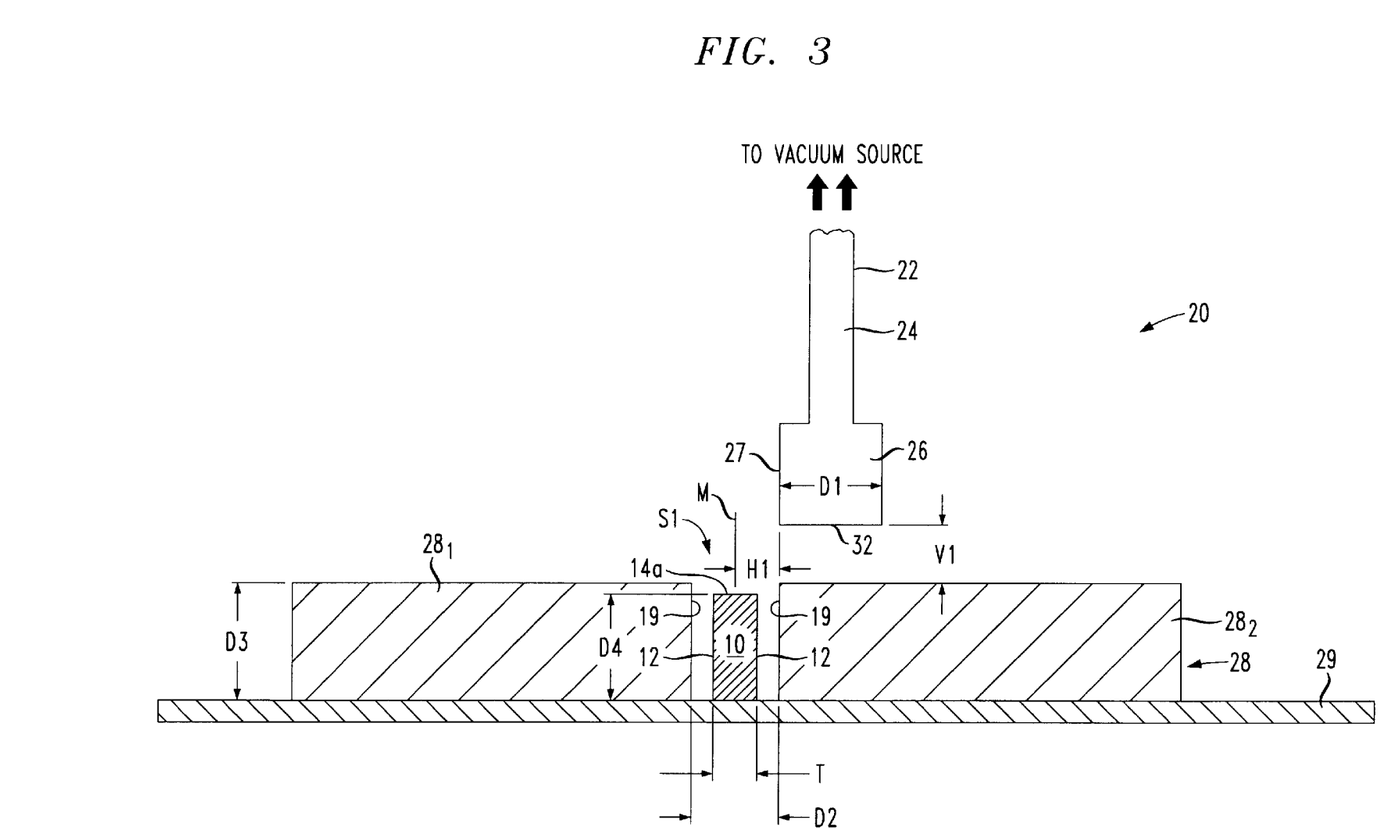
FIG. 3 is a cross-sectional view of a portion of the apparatus of FIG. 2 taken along the lines 3—3.

Turning now to the cross-sectional view of FIG. 3, laser bar 10 is situated in a typical position following the separation of the fixture blades, i.e., centered within slot S1. Receiving end 26 is shown in the pre-vacuum position, ready to receive laser bar 10. In this position, the bottom surface 32 of receiving end 26 is offset vertically by a distance V1 from the top surface of fixture blades $28_1$, $28_2$. Also, side surface 27 of receiving end 26 is offset by a distance H1 with respect to midsection M of slot S1. The offsets H1 and V1, as well as the cross-sectional width D1 of receiving end 26, are selected in conjunction with the dimensions of laser bar 10 and slot S1, so as to prevent top facet surface 14a from making substantial contact with any surface of receiving end 26 during the vacuum pull operation. Merely by way of example, the following dimensions may be used to prevent such contact with the facets in most instances: for a laser bar thickness (T), height (D4), and length (in the direction into the paper) on the order of 5 mils (0.005 inch), 12 mils and 300 mils, respectively, a slot width D2 of about 8–10 mils and fixture blade height D3 of about 12 mils—distance V1 may be about twice the laser bar thickness; distance H1 may be half the slot width so that edge surface 27 is approximately aligned with edge surface 19 of fixture blade $28_2$; and a vacuum collet cross section D1 of approximately the laser bar height, e.g., 12 mils, may be used.

Figure 7:
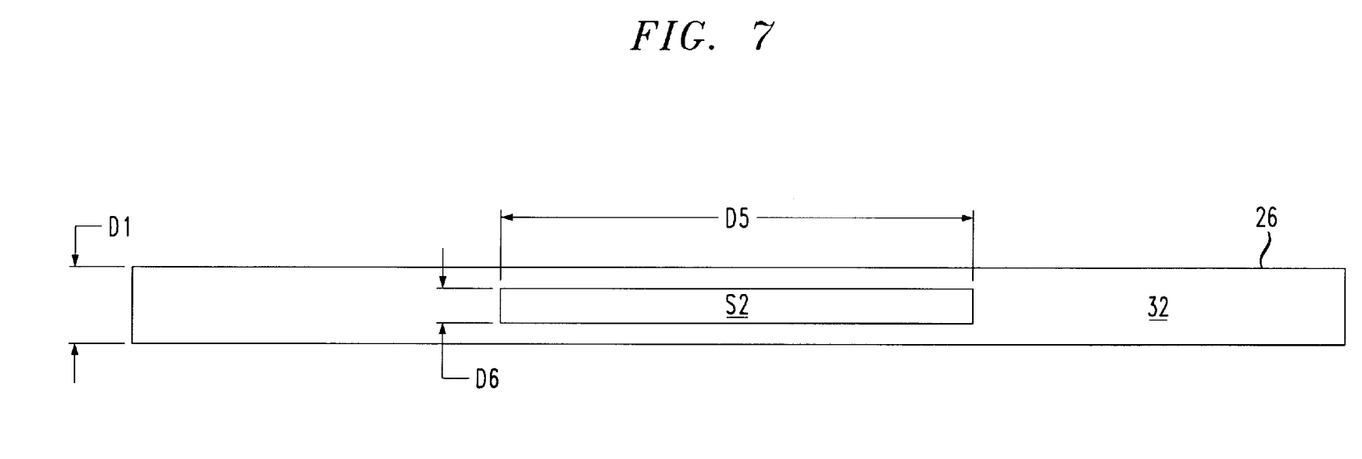
FIG. 7 is a bottom view of a vacuum collet used in the exemplary apparatus.

FIG. 7 is a bottom view of receiving end 26 showing bottom surface 32. A vacuum slot S2 is centrally located within receiving end 26 runs through from bottom surface 32 to collet portion 22 where it may taper off to a smaller dimension. Typically, the length of slot S2 may be about one fourth the length of receiving end 26, e.g., with a length D5 of 80 mils for a 300 mil long receiving end, and a width D6 of 7 mils for a receiving end width D1 of 12 mils. The perimeter dimensions of bottom surface 32 are preferably about the same as those for the laser bar longitudinal side surface 12. Bottom surface 32 is a polished, smooth surface designed to minimize damage to the laser bar.

Returning now to FIG. 3, the shown pre-vacuum position is preferably a predetermined position that vacuum collet 22 is automatically placed in each time a laser bar is to be removed, regardless of the precise position and orientation of laser bar 10 within slot S1 following the fixture blade separation. In some cases the laser bar will not stand vertically in the center of the slot but will rather be offset or tilted towards one side of the slot; however, the inventive method has nevertheless been proven reliable when using the same predetermined pre-vacuum position for these cases as that for the usual laser bar position and orientation.

Figure 4:
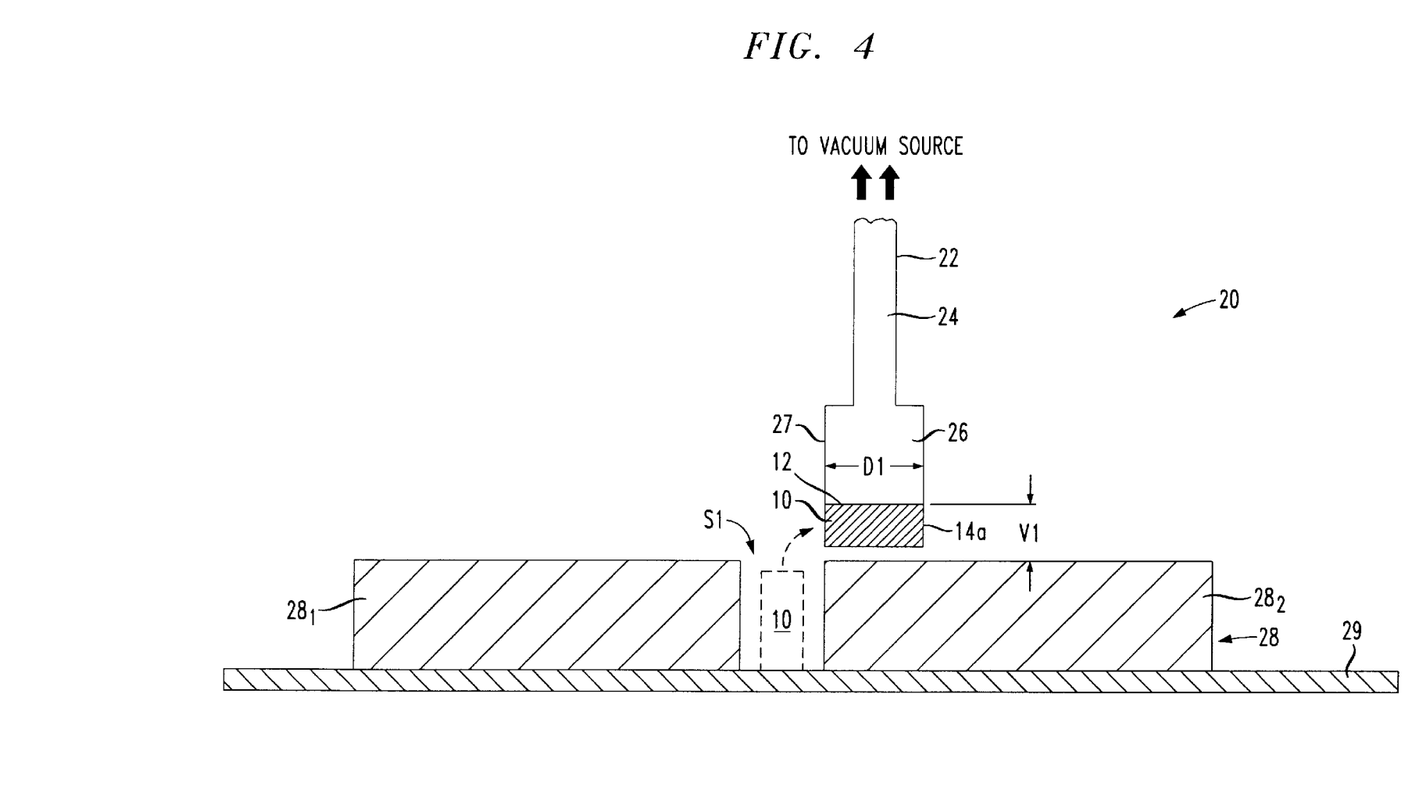
FIGS. 4 and 5 are cross sectional views of the apparatus of FIG. 2 during different stages of the laser bar removal process.

Turning now to FIG. 4, with vacuum collet 22 in the pre-vacuum position, the vacuum from vacuum source 16 is manually or automatically turned on. (Suitable control electronics to automatically control application of the vacuum from vacuum source 16 may be part of positioning control system 17.) The vacuum suction pulls laser bar 10 out of slot S1 such that the laser bar flips by 90° and is pulled flat against the lower surface 32 of receiving end 26. By proper selection of the respective horizontal and vertical offsets H1 and V1, only the longitudinal surface 12 of laser bar 10 comes into contact with any surface of receiving end 26, whereas no contact (or only minimal contact) is made with facets 14a, 14b. Also, contact between the edges of fixture blades $28_1$, $28_2$ and the facets is minimal. It is noted that the vacuum is preferably turned on suddenly rather than gradually, whereby the laser bar "jumps up" to the shown abutting relationship with receiving end 26. A vacuum pressure of typically 20 inches Hg may be used in conjunction with the above-noted laser bar and collet dimensions to achieve reliable, high yield laser bar removal. Typically, the laser bar winds up aligned with the bottom surface 32 as shown following the vacuum application.

Figure 5:
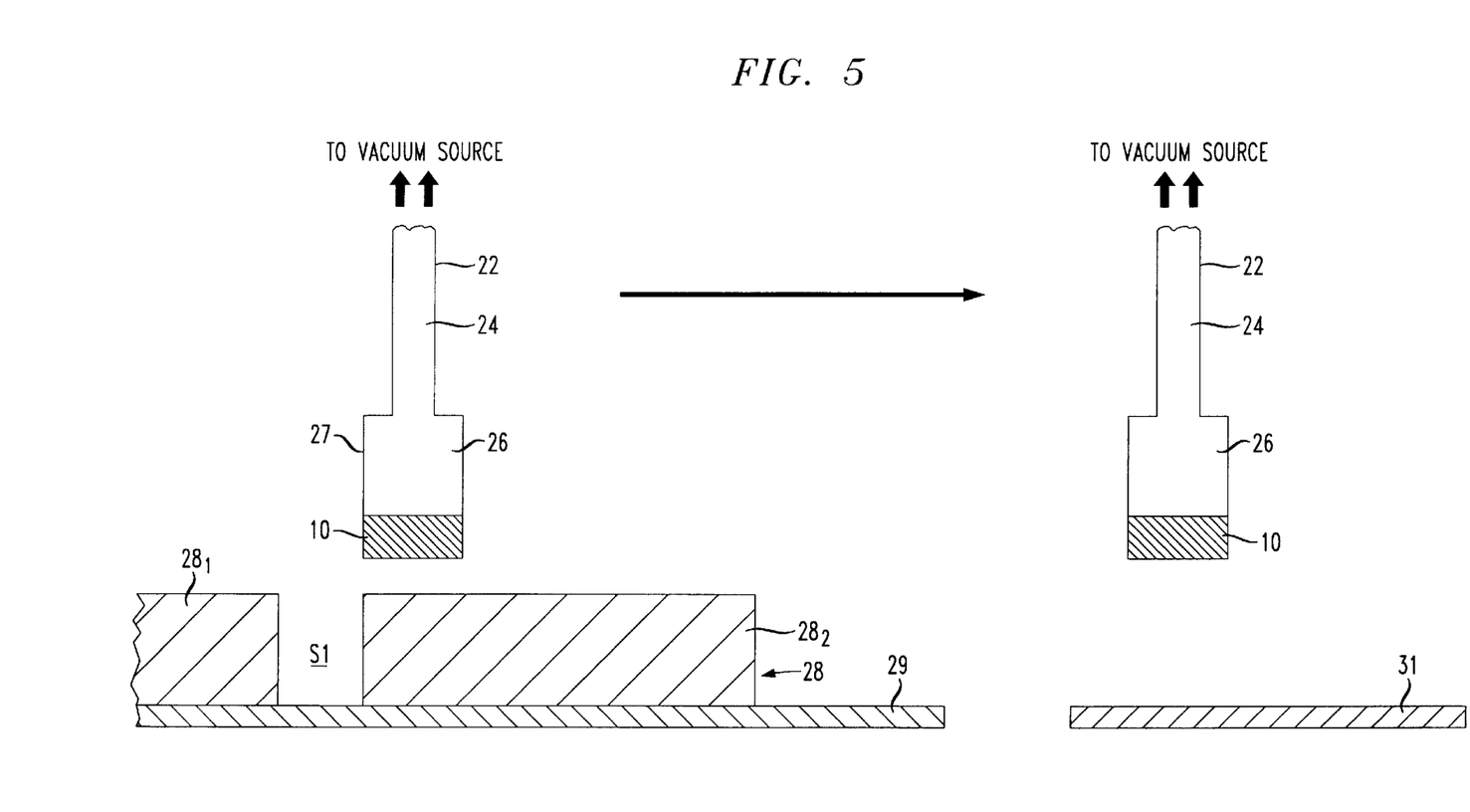
Figure 6:
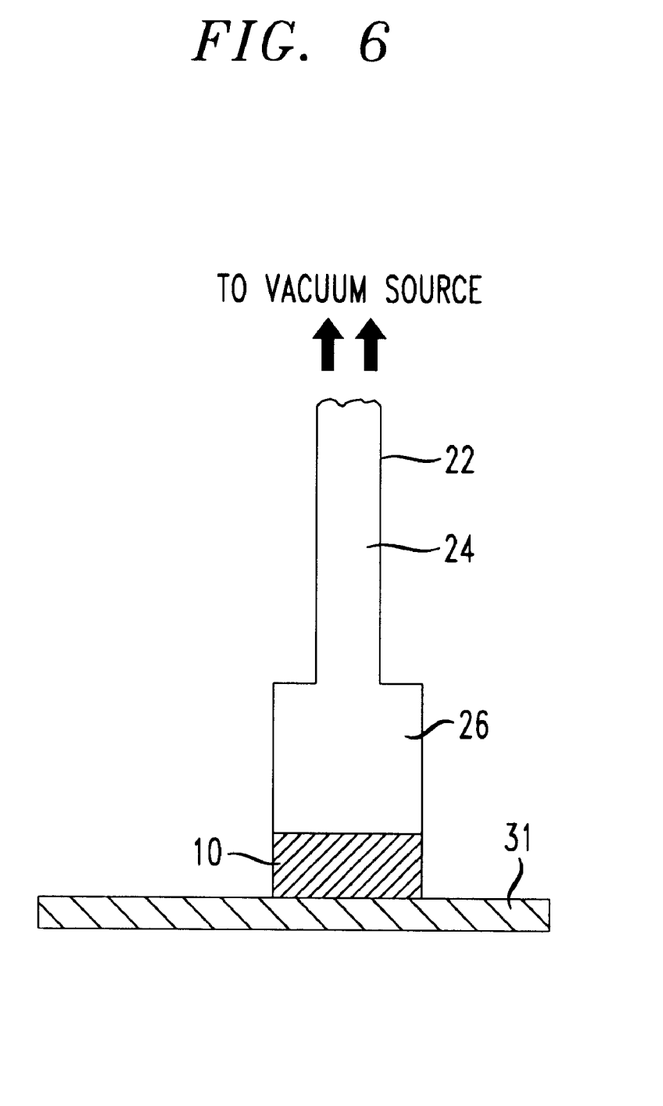
FIG. 6 illustrate the placement of a laser bar onto a receiving surface by the exemplary transporting apparatus.

Referring to FIG. 5, with the vacuum from vacuum source 16 still applied, vacuum collet 22 is translated horizontally to a desired location away from holding fixture 28, above a surface 31. Surface 31 may be an adhesive surface or a surface of a "laser pack", for example, from which the laser bar was removed preceding the facet coating operation. Next, as shown in FIG. 6, vacuum collet 22 is slowly lowered towards surface 31 until the bottom longitudinal surface 12 of laser bar 10 is slightly above or contacts surface 31. The vacuum is then shut off, releasing laser bar 10 onto surface 31 where it is in position for the succeeding manufacturing or testing operation. Once the laser bar is delivered, vacuum collet 22 is raised from surface 31 and translated back to the pre-vacuum position to commence another removal procedure.

From the foregoing, thus disclosed is a method and apparatus for automatically removing a laser bar from a facet coat holding fixture and transporting the laser bar to another location during a laser device manufacturing process. Advantageously, the automatic method is relatively simple and efficient as compared to prior art techniques. Since damage to laser bar facet surfaces is inherently avoided during the removal operation, the process is carried out with a high yield.

While the present invention has been described above with reference to specific embodiments thereof, it is understood that one skilled in the art may make many modifications to the disclosed embodiments without departing from the spirit an d scope of the invention. For example, while the invention has been described in the context of removing and transporting a laser bar from the slot of a facet coat holding fixture, it may also be used to transport laser bars during other stages of the manufacturing process, such as prior to facet coating. Further, the invention may be employed to remove and transport other small objects aside from laser bars. Accordingly, these and other modifications are intended to be included within the scope of the invention as defined by the appended claims.

What is claimed is:

1. A method for transporting a laser bar having facets on opposing sides thereof, said method comprising the steps of:
   automatically positioning a vacuum collet at a position which is vertically and horizontally offset from a facet of said laser bar;
   applying a vacuum to said vacuum collet sufficient to pull said laser bar against said vacuum collet and hold said laser bar in place, with said vacuum collet contacting a longitudinal side surface of said laser bar and substantially avoiding contact with said laser bar facets; and
   transporting said vacuum collet while maintaining said vacuum to thereby transport said laser bar.

2. The method of claim 1 wherein said vacuum is applied suddenly at a predetermined value sufficient for said laser bar to twist by 90 degrees such that said longitudinal surface abuts a bottom surface of said collet.

3. The method of claim 1, further comprising the steps of transporting said vacuum collet, with said vacuum still applied, towards a laser bar receiving surface and releasing the vacuum when said laser bar is in proximity to said receiving surface to thereby place said laser bar thereon.

4. A method for removing a generally solid rectangular laser bar from within a slot of a holding fixture, said laser bar being disposed in said slot with a facet thereof facing outward from said slot and with longitudinal side surfaces thereof facing towards respective side surfaces of said holding fixture, said method comprising the steps of:
   automatically positioning a vacuum collet at a position which is vertically and horizontally offset from said outward facing facet of said laser bar;
   applying a vacuum to said vacuum collet sufficient to pull said laser bar against said vacuum collet and hold said laser bar in place, with said vacuum collet contacting a longitudinal surface of said laser bar and substantially avoiding contact with said laser bar facets; and
   transporting said vacuum collet with respect to said fixture while maintaining said vacuum to thereby transport said laser bar from said fixture.

5. The method of claim 4 wherein said vacuum is applied suddenly at a predetermined value sufficient for said laser bar to twist by 90 degrees such that said longitudinal surface abuts a bottom surface of said collet.

6. The method of claim 4 wherein prior to the removal of said laser bar, said laser bar is oriented in said slot with one facet thereof facing in a generally upward direction, and said vacuum collet is offset vertically and horizontally with respect to said slot.

7. The method of claim 4 wherein prior to removal of said laser bar, said laser bar is positioned within said slot which is formed by separation of plural laser bar holding fixture blades, and said vacuum collet includes a generally solid rectangular receiving end, with a side surface thereof substantially aligned with an edge surface of one of said fixture blades just prior to the application of said vacuum.

8. The method of claim 4, further comprising the steps of transporting said vacuum collet, with said vacuum still applied, towards a laser bar receiving surface and releasing the vacuum when said laser bar is in proximity to said receiving surface to thereby place said laser bar thereon.

9. The method of claim 4 wherein said vacuum collet includes a receiving end having a bottom surface for contacting said laser bar, said receiving end having a long, thin centrally located slot through which said vacuum is applied.

10. The method of claim 9 wherein said receiving end bottom surface has approximately the same perimeter dimensions as said laser bar longitudinal surface.

11. A laser bar transporting apparatus for use in conjunction with a laser bar facet coat holding fixture, said holding fixture having fixture blades for holding a laser bar during a facet coating operation, said blades being separated following the facet coating operation to define a slot therebetween in which said laser bar is disposed, said laser bar being generally solid rectangular with facets on opposing sides thereof, said transporting apparatus comprising:
   a vacuum source;
   a vacuum collet having a receiving end; and
   a positioning system operably coupled to said vacuum collet and operative to position said vacuum collet at a location in which said receiving end is vertically and horizontally offset from a facet of said laser bar, wherein said vacuum source applies a vacuum to said vacuum collet so positioned, said vacuum being sufficient to pull said laser bar from said slot against said vacuum collet and hold said laser bar in place, with said vacuum collet contacting a longitudinal surface of said laser bar and substantially avoiding contact with said laser bar facets; and
   said positioning system further operative to transport said vacuum collet while said vacuum is maintained to thereby transport said laser bar from said fixture.

12. The transporting apparatus of claim 11 wherein said vacuum is applied suddenly at a predetermined value sufficient for said laser bar to twist by 90 degrees such that said laser bar is held with said longitudinal surface in abutting relation to a bottom surface of said collet.

13. The transporting apparatus of claim 11 wherein said vacuum collet receiving end is of a generally solid rectangular shape, with a side surface thereof substantially aligned with an edge of said slot just prior to application of said vacuum.

14. The transporting apparatus of claim 11 wherein said positioning system is further operative to transport said vacuum collet, with said vacuum still applied, towards a laser bar receiving surface, said vacuum being released when said laser bar is in proximity to said receiving surface to thereby place said laser bar thereon.

15. The transporting apparatus of claim 11 wherein prior to the removal of said laser bar from said fixture slot, said laser bar is oriented with one facet thereof facing in a generally upward direction and an opposing facet resting on a surface.

16. The transporting apparatus of claim 11 wherein said vacuum collet receiving end has a long, thin centrally located slot through which said vacuum is applied.

17. The transporting apparatus of claim 11 wherein said vacuum collet receiving end has approximately the same perimeter dimensions as said laser bar longitudinal surface.

18. The transporting apparatus of claim 11 wherein said vacuum collet includes an elongated portion with a smaller cross-sectional area than said receiving end, said vacuum being applied to said elongated portion.

* * * * *